United States Patent
Goto et al.

(10) Patent No.: US 6,522,676 B1
(45) Date of Patent: Feb. 18, 2003

(54) NITRIDE SEMICONDUCTOR LASER DEVICE

(75) Inventors: Takenori Goto, Moriguchi (JP); Nobuhiko Hayashi, Osaka (JP)

(73) Assignee: Sanyo Electric Co., LTD, Osaka (JP)

( * ) Notice: Subject to any disclaimer, the term of this patent is extended or adjusted under 35 U.S.C. 154(b) by 0 days.

(21) Appl. No.: 09/492,008

(22) Filed: Jan. 27, 2000

(30) Foreign Application Priority Data

Jan. 26, 1999 (JP) .......................................... 11-016559

(51) Int. Cl.⁷ ................................................ H01S 5/00
(52) U.S. Cl. ............................ 372/43; 372/43; 372/44; 372/45; 372/46
(58) Field of Search .................................. 372/43–46, 5

(56) References Cited

U.S. PATENT DOCUMENTS

| | | | |
|---|---|---|---|
| 5,822,348 A | 10/1998 | Fuji | |
| 5,932,896 A | 8/1999 | Sugiura et al. | |
| 5,974,069 A | * 10/1999 | Tanaka et al. | ................. 372/46 |
| 6,274,891 B1 | * 8/2001 | Tanaka et al. | ................. 257/99 |

FOREIGN PATENT DOCUMENTS

| | | |
|---|---|---|
| JP | 02-178989 | 7/1990 |
| JP | 06013709 | 1/1994 |
| JP | 06-013709 | 1/1994 |
| JP | 09148671 | 6/1997 |
| JP | 09-205249 | 8/1997 |
| JP | 10-135575 | 5/1998 |
| JP | 11112092 | 4/1999 |

OTHER PUBLICATIONS

"A Theoretical Analysis of Self–Sustained Pulsation Phenomena in Narrow–Stripe Semiconductor Lasers," IEEE Journal of Quantum Electronics, vol. 29, No. 5, May 1993, pp. 1330–1336.

"Low–Noise AlGaAs Lasers Grown by Organo–Metallic Vapor Phase Epitaxy," IEEE Journal of Quantum Electronics, vol. 25, No. 6, Jun. 1989, pp. 1483–1488.

* cited by examiner

Primary Examiner—Paul Ip
Assistant Examiner—Delma R. Flores Ruiz
(74) Attorney, Agent, or Firm—Rader Fishman & Grauer

(57) ABSTRACT

A nitride semiconductor device of the self-pulsation type comprises as superposed on a substrate 1 an n-type cladding layer 3, active layer 4 and p-type cladding layer including an upwardly projecting stripe portion 53, an n-type current blocking layer 6 being formed at each of opposite sides of the stripe portion 53. The stripe portion 53 of the p-type cladding layer 5 comprises an upper stripe portion 51 and a lower stripe portion 52. The upper stripe portion 51 has a minimum width W1 at the position of the boundary between the upper and lower stripe portions 51, 52, and the lower stripe portion 52 has at the position of its lower end a width W2 greater than the minimum width W1 of the upper stripe portion 51. This construction realizes a higher yield than in the prior art.

28 Claims, 11 Drawing Sheets

(a)

(b)

(c)

(d)

(e)

(a)

(b)

(c)

(d)

(a)

(b)

(c)

(d)

NITRIDE SEMICONDUCTOR LASER DEVICE

FIELD OF THE INVENTION

The present invention relates to laser devices comprising a nitride semiconductor, and more particularly to nitride semiconductor laser devices adapted for self-pulsation.

BACKGROUND OF THE INVENTION

Semiconductors laser devices have found wide application to optical communication, optical recording and various other fields and are prevalent used especially in the field of optical recording chiefly in optical disk systems. In the case where semiconductor laser devices are used as light sources for optical disk systems, the diameter of the spot of light focused on the optical disk by an objective lens is directly proportional to the lasing wavelength of the semiconductor laser device, so that the shorter the lasing wavelength, the smaller the spot diameter on the optical disk is and the greater the recording capacity of the disk is. While AlGaInP semiconductor laser devices heretofore in actual use are about 650 nm in lasing wavelength, nitride semiconductor laser devices are as short as about 400 nm in lasing wavelength. Accordingly progress has been made in developing nitride semiconductor lasers to achieve increased recording capacities in optical disk systems.

Already known as semiconductor laser devices having a double heterojunction structure are the ridge stripe semiconductor laser device shown in FIG. 11, and the self-aligned semiconductor laser device shown in FIG. 12.

With reference to FIG. 11, the ridge stripe semiconductor laser device comprises an n-type cladding layer 3, active layer 4, p-type cladding layer 561, n-type current blocking layer 611 and p-type contact layer 7 which are superposed on a substrate 10, for example, of sapphire. The p-type cladding layer 561 has an upwardly projecting ridge stripe portion 50.

As shown in FIG. 12, the self-aligned semiconductor laser device comprises an n-type cladding layer 3, active layer 4, p-type first cladding layer 57, n-type current blocking layer 62, p-type second cladding layer 58 and p-type contact layer 7 which are superposed on a substrate 10, for example, of sapphire. The p-type second cladding layer 58 has a downwardly projecting ridge stripe portion 60.

The ridge stripe semiconductor laser device is fabricated by the process shown in FIG. 13, (a) to (d). First as seen in FIG. 13, (a), an n-type contact layer 2, n-type cladding layer 3, active layer 4 and p-type cladding layer 59 are formed as superposed on a substrate 10, and a mask 15 is then formed on the surface of the p-type cladding layer 59. Next as shown in FIG. 13, (b), the p-type cladding layer 59 is dry-etched with the mask 15 provided thereon to form a ridge stripe portion 50. Subsequently as seen in FIG. 13, (c), an n-type current blocking layer 611 is selectively grown utilizing the mask 15 remaining on the ridge stripe portion 50, the mask 15 is thereafter removed, and a p-type contact layer 7 is grown as shown in FIG. 13, (d).

In fabricating AlGaAs infrared semiconductor laser devices or AlGaInP red semiconductor laser devices, the ridge stripe portion 50 can be formed with high accuracy by inserting in advance into the p-type cladding layer an etching stop layer which is more resistant to a specified etchant than the p-type cladding layer. However, since no suitable etchant has been found for use in fabricating nitride semiconductor laser devices, it is difficult to form the ridge stripe portion by such chemical etching. It is therefore conventional practice to form the ridge stripe portion 50 by dry-etching the p-type cladding layer 59 as seen in FIG. 13, (a) and (b).

The self-aligned semiconductor laser device is fabricated by the process shown in FIG. 14, (a) to (c). First as seen in FIG. 14, (a), an n-type contact layer 2, n-type cladding layer 3, active layer 4, p-type first cladding layer 57 and n-type current blocking layer 63 are formed as superposed on a substrate 10, and masks 16, 16 are formed on the surface of the n-type current blocking layer 63. Next as shown in FIG. 14, (b), the n-type current blocking layer 63 is dry-etched through the masks 16, 16 to locally remove the current blocking layer 63 to a depth where the p-type first cladding layer 57 becomes exposed. Subsequently as shown in FIG. 14, (c), the masks 16, 16 are removed to grow a p-type second cladding layer 58 and p-type contact layer 7.

However, the fabrication of the ridge stripe semiconductor laser device requires three crystal growth steps. It is also required to control the thickness t of the p-type cladding layer 561 beneath the n-type current blocking layer 611 by dry etching, whereas difficulty is encountered in controlling this thickness. If the thickness of the cladding layer 561 is smaller than the proper value, it is difficult to effect the self-pulsation to be described below, while if the thickness of the cladding layer 561 is greater than is proper, the n-type current blocking layer 611 to be grown subsequently will have a smaller thickness, failing to effectively block the current.

On the other hand, two crystal growth steps suffice to fabricate the self-aligned semiconductor laser device. Furthermore, the thickness of the p-type cladding layer 57 beneath the n-type current blocking layer 62 can be controlled by crystal growth. With this type of laser device, nevertheless, dry etching for locally removing the current blocking layer is likely to cause damage to the light-emitting portion and current injection region, and such damage is likely to produce an adverse effect on the emission of light.

It is required that the optical disk player comprising a semiconductor laser device as its optical component be low in noise against optical feedback from the optical disk. Accordingly it is practice to obtain multimode operation by superposing high-frequency waves of about several hundreds of megahertz to about 1 GHz on the drive signal for a semiconductor laser device of the single-mode pulsation type, or to cause semiconductor laser devices to undergo self-pulsation (see, for example, "Theoretical Analysis of Self-Pulsation Phenomena in Semiconductor Lasers," Technical Report of Society of IEICE, OQE92-16).

The method of obtaining a multimode by the superposition of high-frequency waves requires an external circuit, so that the method of effecting self-pulsation is desirable from the viewpoint of compacting the device and cost reductions. Self-pulsation occurs by forming a light absorbing region termed a saturable absorbing region in the active layer around the region thereof where current is injected (active region).

Accordingly used in fabricating ridge stripe or self-aligned semiconductor laser devices is a method of giving a spot width greater than the width of the current injection region to effect self-pulsation, by optimizing device structure parameters such as the stripe width W, the thickness t of the p-type cladding layer 561 beneath the n-type current blocking layer 611 and the thickness d of the active layer 4.

Also used is a method of causing side portions of the current injection region within the active layer to act as a saturable absorbing region by giving the active layer an increased thickness.

With the ridge stripe semiconductor laser device shown in FIG. 11, however, the ridge stripe portion 50 flares downward in cross section, so that current is injected as spread out along this configuration into the active layer 4. As a result, a current injection region is provided which spreads out beyond the width W of the stripe portion 50 at the position of its lower end, and the width of the current injection region becomes approximately equal to the spot width.

Further with the self-aligned semiconductor laser device of FIG. 12 wherein the ridge stripe portion 60 is tapered downward in cross section, current is injected as confined in this configuration into the active layer 4. Consequently, a current injection region is provided which is narrower than the width W of the stripe portion 60 at the position of its lower end. Since the spot width is also diminished, the width of the current injection region becomes approximately equal to the spot width.

Thus in the case of the conventional semiconductor laser devices, the width of the current injection region becomes approximately equal to the spot width whether the device is of the ridge stripe type or self-aligned type, so that the optimization of device structure parameters such as the stripe width W of the ridge stripe portion, the thickness t of the cladding layer and the thickness d of the active layer encounters the problem that the freedom of selecting the parameters is small.

In order to fabricate self-pulsation semiconductor laser devices in a high yield, there is a need to give accurate parameters to each device structure as finished, whereas the accuracy of the stripe width W is dependent on the dimensional accuracy of the mask, that of the cladding layer thickness t on the controllability of etching and that of the active layer thickness d on the controllability of the thickness to be obtained by crystal growth. Because difficulty is encountered especially in controlling the amount of layer to be removed by dry etching for forming the ridge stripe portion, it is impossible to obtain the cladding layer thickness t with high accuracy, hence the problem of a low yield.

Further increasing the thickness of the active layer gives rise to the problem of increased threshold current or a greater astigmatic distance.

SUMMARY OF THE INVENTION

Accordingly, an object of the present invention is to provide a nitride semiconductor laser device of the self-pulsation type which has a short lasing wavelength and is not increased in threshold current and astigmatic distance and which can be fabricated in a higher yield than conventionally.

The present invention provides a nitride semiconductor laser device comprising a first cladding layer 3 formed on a substrate and made from a first conductive-type nitride semiconductor, an active layer 4 formed on the first cladding layer 3, and a second cladding layer 5 formed on the active layer 4 and made from a second conductive-type nitride semiconductor. The second cladding layer 5 comprises a flat portion 5a formed over the active layer 4 and a dual stripe portion 53 projecting upward from the midportion of the flat portion 5a, and a current blocking layer 6 of a first conductive-type nitride semiconductor is formed at each of opposite sides of the dual stripe portion 53.

The dual stripe portion 53 of the second cladding layer 5 comprises a lower stripe portion 52 formed on the flat portion 5a and an upper stripe portion 51 formed on the lower stripe portion 52. The dual stripe portion 53 varies in cross sectional area toward the flat portion 5a. The rate of variation in the cross sectional area of the portion 53 increases toward a positive direction from the position of the boundary between the upper stripe portion 51 and the lower stripe portion 52.

The term "first conductive-type" means one of p-type and n-type, and the term "second conductive-type" means the other of these types.

With the nitride semiconductor laser device of the invention described, the second cladding layer 5 has a dual stripe portion 53 comprising an upper stripe portion 51 and a lower stripe portion 52, and the rate of variation in the cross sectional area of the dual stripe portion 53 increases in the positive direction from the position of the boundary between the upper and lower stripe portions 51, 52, so that the upper stripe portion 51 is smaller than the lower stripe portion 52 in cross sectional area at least in the vicinity of the boundary position.

Since it is difficult to give an increased carrier concentration to the p-type semiconductor layer especially in nitride semiconductor laser devices, the current confined in the upper stripe portion 51 encounters difficulty in spreading out laterally.

Accordingly, the current flowing through the dual stripe portion 53 of the second cladding layer 5 toward the active layer 4 flows into the active layer 4 while being restrained by the upper stripe layer 51 from spreading out laterally. Further because the lower stripe portion 52 has a greater width than the upper stripe portion 51, the width of the spot to be formed in the active layer 4 becomes greater than the width of the current injection region.

Consequently, a saturable absorbing region is formed around the current injection region, giving rise to self-pulsation.

The rate of variation in the cross sectional area of the dual stripe portion 53 increases toward the positive direction from the position of the boundary between the upper stripe portion 51 and the lower stripe portion 52, for example, in an embodiment wherein the upper stripe portion 51 is made approximately constant or decreased in cross sectional area toward the flat portion 5a, and the dual stripe portion 53 is markedly increased in cross sectional area at the position of the boundary between the upper stripe portion 51 and the lower stripe portion 52.

The present invention provides another nitride semiconductor laser device wherein a second cladding layer 5 has a dual stripe portion 53 comprising a lower stripe portion 52 formed on the flat portion 5a and an upper stripe portion 51 formed on the lower stripe portion 52, the width of the upper stripe portion 51 in a direction orthogonal to the longitudinal direction thereof being smaller than the width of the lower stripe portion 52 in the same orthogonal direction.

For example, the upper stripe portion 51 has a minimum width W1 at the position of the boundary between the upper and lower stripe portions 51, 52, and the lower stripe portion 52 has at the position of its lower end a width W2 greater than the minimum width W1 of the upper stripe portion 51.

Alternatively, the lower stripe portion 52 projects outward beyond each of opposite side faces of the upper stripe portion 51 at and below the position of the boundary between the upper and lower stripe portions 51, 52, and the projection has an upper face substantially parallel to an upper surface of the active layer 4, the lower stripe portion 52 having a greater width than the upper stripe portion 51 at the position of the boundary between the upper and lower stripe portions 51, 52.

When the dual stripe portion 53 is thus constructed, the width W1 of the upper stripe portion 51 is smaller than the width W2 of the lower stripe portion 52, so that the current flowing through the dual stripe portion 53 toward the active layer 4 is restrained by the width W1 of the upper stripe portion 51 and flows into the active layer 4 while being restrained from spreading out laterally. Accordingly, the current injection region of the active layer 4 has a width in conformity with the width W1 of the upper stripe portion 51.

On the other hand, the lower stripe portion 52, which is enlarged as compared with the upper stripe portion 51, laterally increases the spot width, with the result that the spot width of the active layer 4 is made to conform to the width W2 of the lower stripe portion 52 and made greater than the width of the current injection region.

Consequently, a saturable absorbing region is formed around the current injection region to give rise to self-pulsation.

Each current blocking layer 6 can be formed from a material greater in band gap energy and smaller in refractive index than the second cladding layer 5. Alternatively, the current blocking layer 6 can be formed from a material smaller than the active layer 4 in band gap energy and guides laser light by absorbing light generated in the active layer 4 in this case.

According to an embodiment, the dual stripe portion 53 of the second cladding layer 5 is so formed that the longitudinal direction of the configuration of the stripe thereof is the direction [1 1 $\bar{2}$ 0] of nitride semiconductor crystals, and the upper stripe portion 51 decreases in cross sectional area toward the flat portion 5a.

In this case, a sapphire substrate or GaP substrate is usable as the substrate.

According to another embodiment, the dual stripe portion 53 of the second cladding layer 5 is so formed that the longitudinal direction of the configuration of the stripe thereof is the direction [1 $\bar{1}$ 0 0] of nitride semiconductor crystals, and the upper stripe portion 51 is approximately constant in cross sectional area toward the flat portion 5a.

Usable as the substrate in this case is a GaN substrate, Si substrate, 6H—SiC substrate, 4H—SiC substrate, MgO substrate or MgAl$_2$O$_4$ substrate.

With the nitride semiconductor laser device according to the present invention, the current injection region width can be defined by the upper stripe portion, and the spot width by the lower stripe portion, so that the device of the invention can be caused to generate self-pulsation more easily than conventional semiconductor laser devices. The construction of the invention therefore gives a higher degree of freedom in optimizing the device structure parameters and affords greater allowable ranges of dimensional accuracies to the parameters than in the case of conventional semiconductor laser devices, making it possible to fabricate self-pulsation semiconductor laser devices in a high yield. Since there is no need to give an increased thickness to the active layer for self-pulsation, self-pulsation can be realized without increasing the threshold current or astigmatic distance.

DETAILED DESCRIPTION OF EMBODIMENTS

Embodiments of nitride semiconductor laser devices of the invention will be described below in detail with reference to the drawings concerned.

First Embodiment

Figure 1:
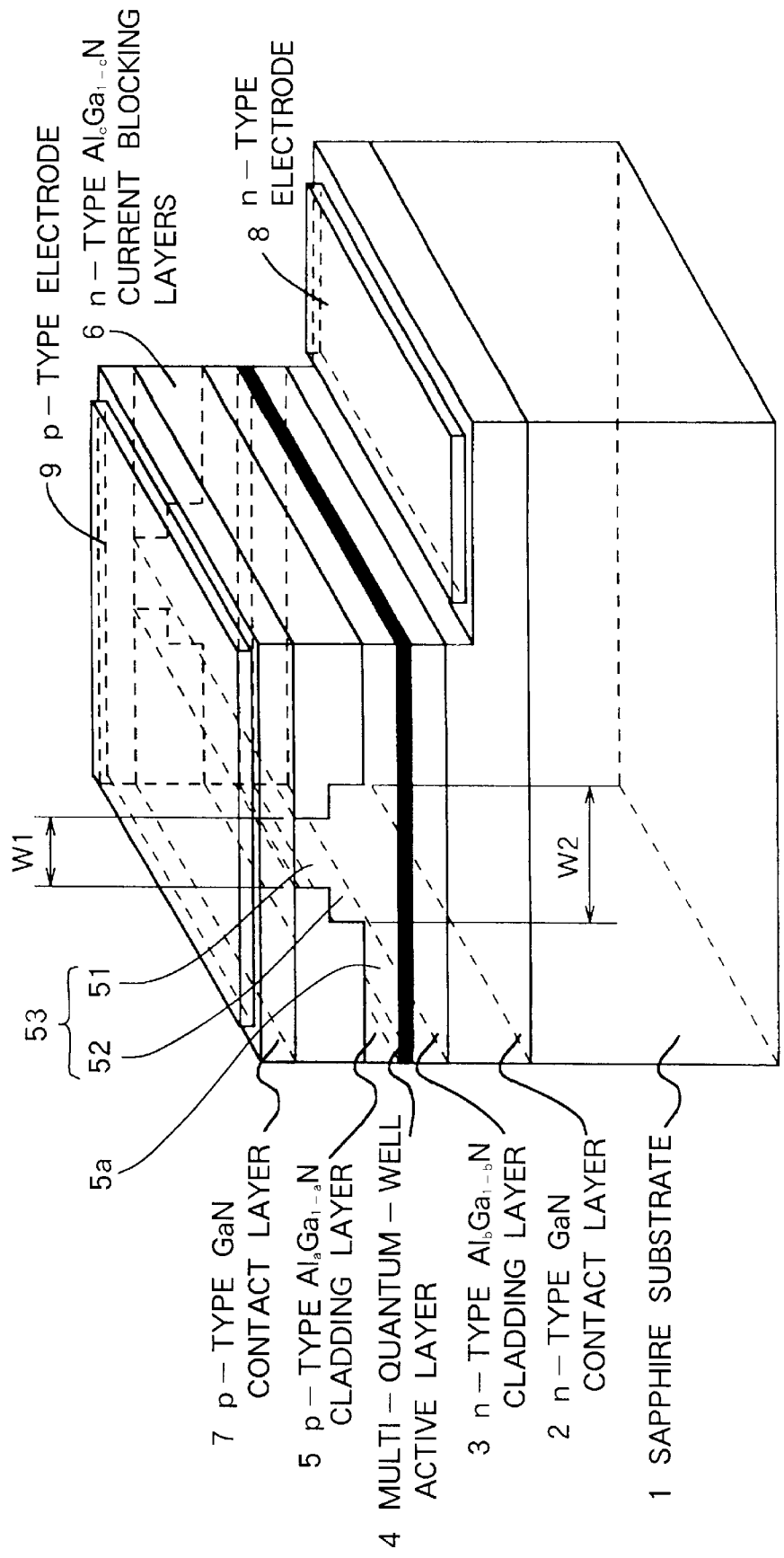
FIG. 1 is a perspective view showing the structure of a nitride semiconductor laser device as a first embodiment the invention.
Figure 2:
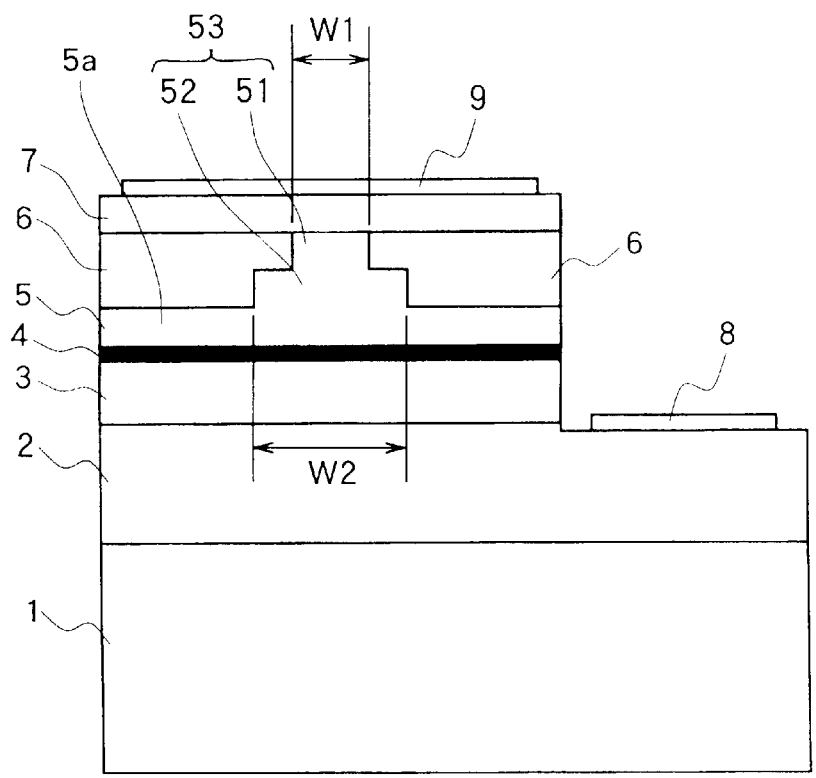
FIG. 2 is a view in section showing the laser device of the first embodiment.

FIGS. 1 and 2 show a nitride semiconductor laser device of this embodiment, which comprises as superposed on a sapphire substrate 1 an n-type contact layer 2 made from GaN and 4.5 $\mu$m in thickness, an n-type cladding layer 3 made from Al$_b$Ga$_{1-b}$N and 0.8 $\mu$m in thickness, an active layer 4 having a multi-quantum-well structure, a p-type cladding layer 5 made from Al$_a$Ga$_{1-a}$N and 0.8 $\mu$m in thickness, n-type current blocking layers 6, 6 made from Al$_c$Ga$_{1-c}$N and a p-type contact layer 7 made from GaN and 0.05 $\mu$m in thickness.

The p-type cladding layer 5 comprises a flat portion 5a formed over the surface of the active layer 5, and a dual stripe portion 53 projecting upwardly from the midportion of the flat portion 5a and comprising a lower stripe portion 52 and an upper stripe portion 51. The dual stripe portion 53 has an upper surface in contact with the p-type contact layer 7 and opposite side faces in contact with the respective n-type current blocking layers 6, 6. The width W1 of the upper stripe portion 51 is smaller than the width W2 of the lower stripe portion 52.

An n-type electrode 8 is provided on the n-type contact layer 2, and a p-type electrode 9 on the p-type contact layer 7.

Figure 3:
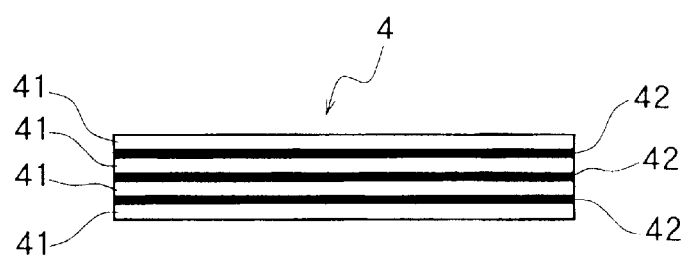
FIG. 3 is a diagram schematically showing the multiple-quantum-well structure of an active layer.

As shown in FIG. 3, the active layer 4 comprises 8-nm-thick well layers 42 of In$_x$Ga$_{1-x}$N and 16-nm-thick barrier layers 41 of In$_y$Ga$_{1-y}$N which are superposed alternately (x>y; for example, x=0.13, y=0.05). The number of well layers 42 is not limited to 3 as illustrated but can be optional.

In the device structure shown in FIG. 1, the n-type current blocking layers 6, 6 of Al$_c$Ga$_{1-c}$N are given a lower refractive index than the p-type cladding layer 5 of $Al_aGa_{1-a}N$ ($0<a<c\leq1$) to thereby realize a real refractive index guided structure, whereas it is possible to realize a loss guided structure wherein the transverse mode is controlled by absorbing light produced in the active layer 4, by forming n-type current blocking layers of $In_zGa_{1-z}N$ in place of the n-type current blocking layers 6, 6 of $Al_cGa_{1-c}N$ and giving a smaller band gap to the blocking layers than to the active layer 4. It is also possible to use a GaN substrate or SiC substrate instead of the sapphire substrate 1.

Figure 4:
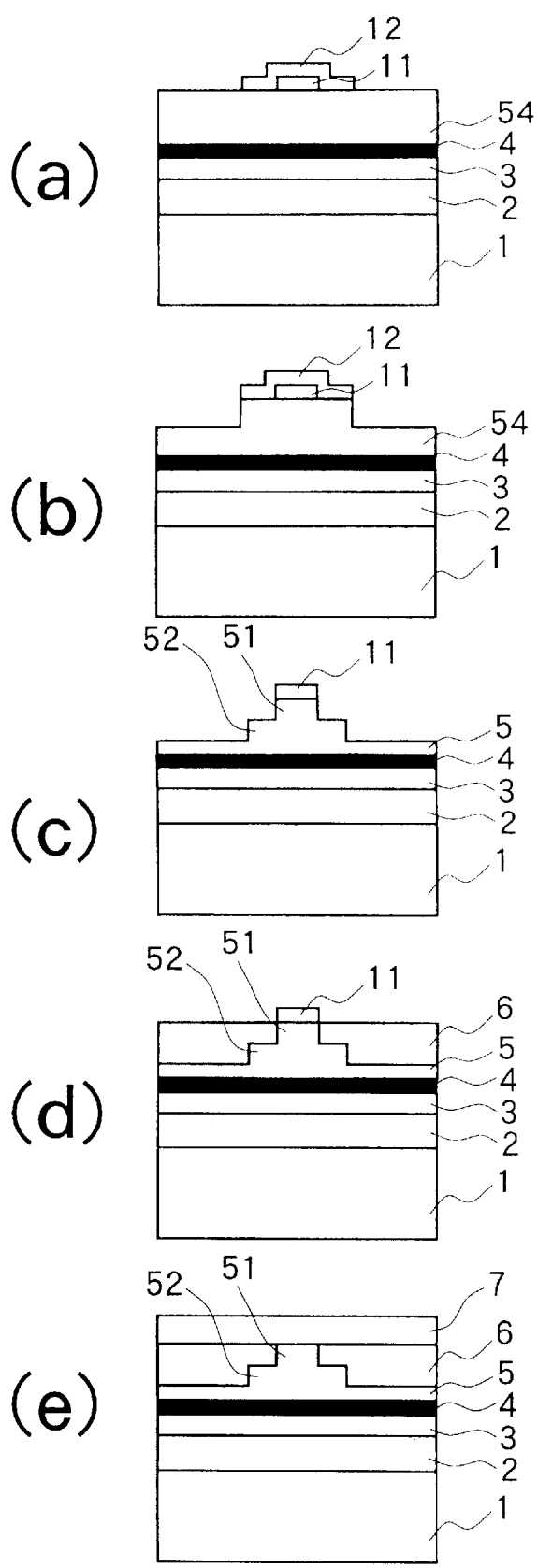
FIG. 4 includes diagrams showing the steps of a process for fabricating the laser device of the first embodiment.

FIG. 4, (a) to (e) shows a process for fabricating the nitride semiconductor laser device described above. As shown in FIG. 4, (a), an n-type contact layer 2, n-type cladding layer 3, active layer 4 and p-type cladding layer 54 are first formed as superposed on a sapphire substrate 1, and a double mask comprising an $SiO_2$ mask 11 and an Ni mask 12 covering the mask 11 is then formed over the p-type cladding layer 54. Next as shown in FIG. 4, (b), the p-type cladding layer 54 is subjected to first dry etching with carbon tetrachloride $CCl_4$ through the masks 11, 12.

The layer 54 is subsequently subjected to second dry etching with chlorine $Cl_2$, whereby the Ni mask 12 is etched away, but the $SiO_2$ mask 11 remains unetched, with the result that the Ni mask 12 including its lower portions is removed to form a dual ridge comprising an upper stripe portion 51 and a lower stripe portion 52 as shown in FIG. 4, (c).

An n-type current blocking layer 6 is thereafter selectively grown utilizing the mask 11 remaining on the ridge as seen in FIG. 4, (d).

The mask 11 is then removed, and a p-type contact layer 7 is thereafter grown eventually as shown in FIG. 4, (e).

Figure 5:
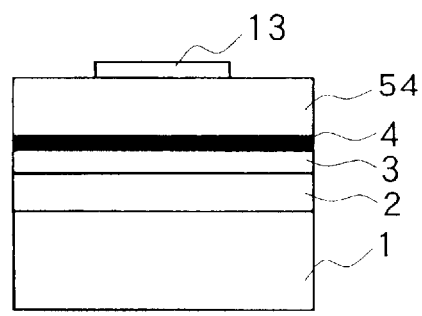
FIG. 5 includes diagrams showing the steps of another process for fabricating the laser device.
Figure 5:
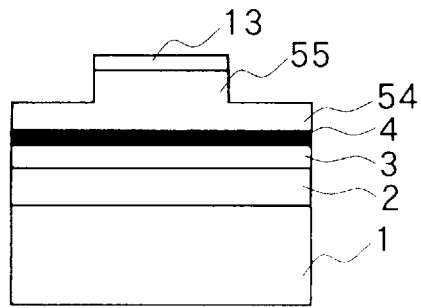
Figure 5:
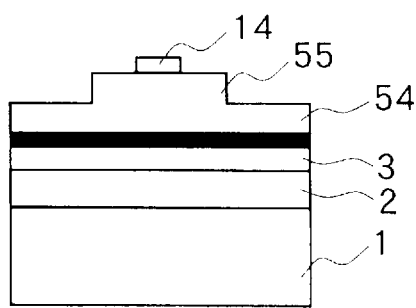
Figure 5:
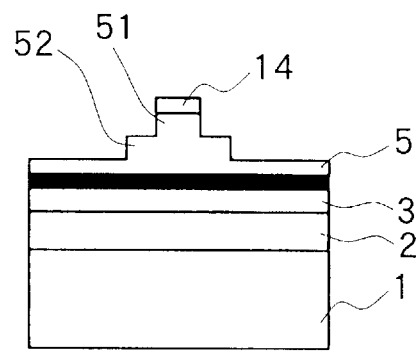
Figure 5:
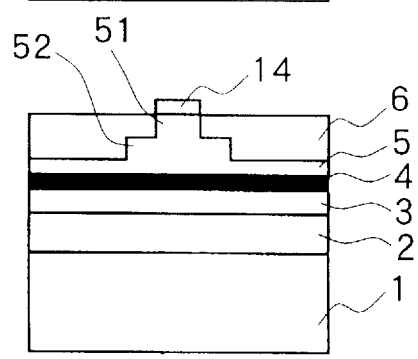

FIG. 5, (a) to (e) shows another process for fabricating the nitride semiconductor laser device described. As shown in FIG. 5, (a), an n-type contact layer 2, n-type cladding layer 3, active layer 4 and p-type cladding layer 54 are first formed as superposed on a sapphire substrate 1, and a mask 13 is thereafter formed over the p-type cladding layer 54. Next as shown in FIG. 5, (b), the p-type cladding layer 54 is subjected to first dry etching with the mask 13 thereon to form a stripe 55.

Next, the mask 13 is removed, and a mask 14 having a width smaller than the ridge width is thereafter formed on the stripe 55 as shown in FIG. 5, (c).

Dry etching is then performed second time with the mask 14 formed on the stripe 55 to form a dual ridge comprising an upper stripe portion 51 and a lower stripe portion 52 as seen in FIG. 5, (d).

An n-type current blocking layer 6 is thereafter selectively grown utilizing the mask 14 remaining on the ridge as seen in FIG. 5, (e).

The mask 14 is then removed, and a p-type contact layer 7 is thereafter grown eventually in the same manner as shown in FIG. 4, (e).

With the nitride semiconductor laser device shown in FIGS. 1 and 2, the width W1 of the upper stripe portion 51 is smaller than the width w2 of the lower stripe portion 52, so that the current flowing through the stripe 53 toward the active layer 4 is confined in the upper stripe portion 51 and flows into the active layer 4 while being restrained from spreading out laterally. Accordingly the current injection region of the active layer 4 has a width in conformity with the width W1 of the upper stripe portion 51.

On the other hand, the lower stripe portion 52, which is larger than the upper stripe portion 51, increases the spot width laterally, consequently giving the spot of the active layer 4 a width in conformity with the width W2 of the lower stripe portion 52 and greater than the width of the current injection region.

As a result, a saturable absorbing region is formed around the current injection region to generate self-pulsation.

Second Embodiment

Figure 6:
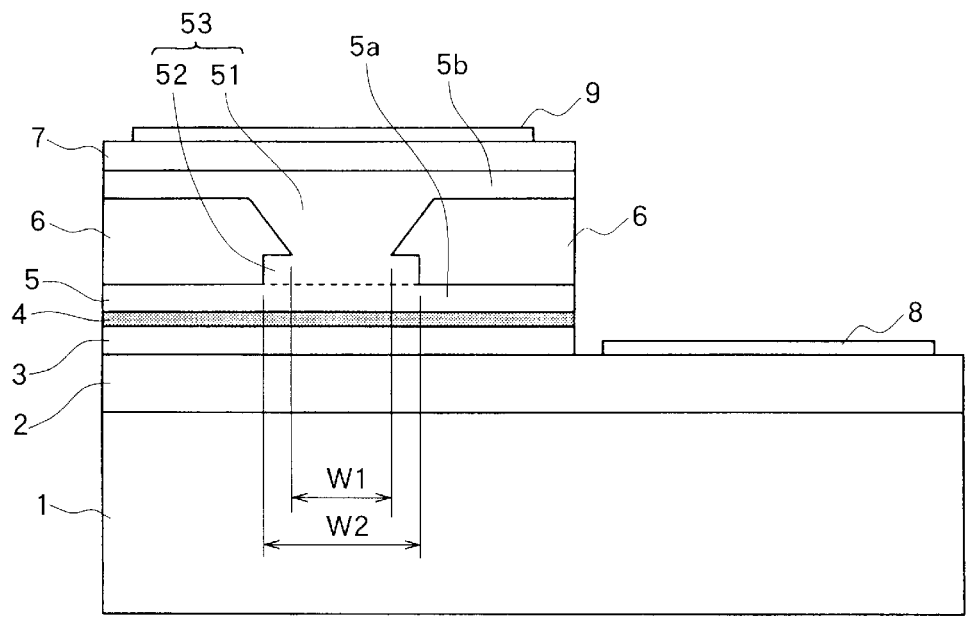
FIG. 6 is a view in section showing the structure of a nitride semiconductor laser device as a second embodiment the invention.

FIG. 6 shows a nitride semiconductor laser device of this embodiment, which comprises as superposed on a sapphire substrate 1 an n-type contact layer 2 made from GaN, an n-type cladding layer 3 made from AlGaN, an active layer 4 having a multi-quantum-well structure, a p-type cladding layer 5 made from AlGaN, n-type current blocking layers 6, 6 made from AlGaN and a p-type contact layer 7 made from GaN.

The p-type cladding layer 5 comprises a first flat portion 5a formed over the surface of the active layer 4, a dual stripe portion 53 projecting upwardly from the midportion of the first flat portion 5a and comprising a lower stripe portion 52 and an upper stripe portion 51, and a second flat portion 5b formed over the dual stripe portion 53 and the n-type current blocking layers 6, 6. The dual stripe portion 53 has opposite side faces in contact with the respective n-type current blocking layers 6, 6.

The n-type contact layer 2 is 4.5 μm in thickness, the n-type cladding layer 3 is 1.0 μm in thickness, the first flat portion 5a of the p-type cladding layer 5 is 0.15 μm in thickness, the n-type current blocking layers 6, 6 are 0.30 μm in thickness, the second flat portion 5b of the p-type cladding layer 5 is 0.10 μm in thickness, and the p-type contact layer 7 is 0.10 μm in thickness.

The dual stripe portion 53 of the p-type cladding layer 5 varies in cross sectional area toward the first flat portion 5a, and the rate of variation in the cross sectional area increases in the positive direction at the position of the boundary between the upper stripe portion 51 and the lower stripe portion 52. More specifically, the cross sectional area of the upper stripe portion 51 decreases toward the first flat portion 5a, and the cross sectional area of the lower stripe portion 52 markedly increases at the position of the boundary between the upper and lower stripe portions 51, 52 and remains substantially unchanged toward the first flat portion 5a. Thus, the upper stripe portion 51 has a minimum width W1 (=2 μm) at the position of the boundary between the portion 51 and the lower stripe portion 52, and the width W1 is smaller than the width W2 (=2.5 μm) of the lower stripe portion 52 at the position of its lower end. The lower stripe portion 52 has a height of 0.1 μm.

Further the dual stripe portion 53 of the p-type cladding layer 5 is so formed that the longitudinal direction of the stripe configuration thereof is the direction [1 1 $\bar{2}$ 0] of the nitride semiconductor crystals.

An n-type electrode 8 is provided on the n-type contact layer 2, and a p-type electrode 9 on the p-type contact layer 7. The active layer 4 has the same structure as in the first embodiment shown in FIG. 3.

Incidentally, a GaP substrate is usable in place of the sapphire substrate 1.

Figure 8:
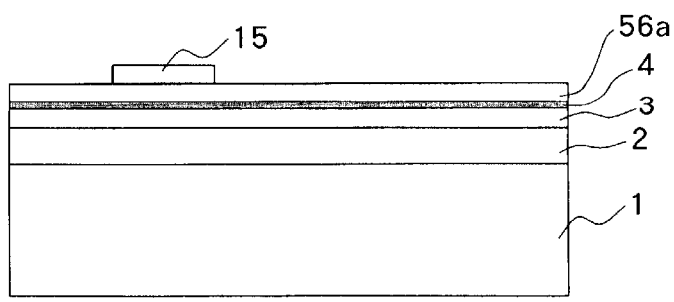
FIG. 8 includes diagrams showing the steps of a process for fabricating the laser device of the second embodiment.
Figure 8:
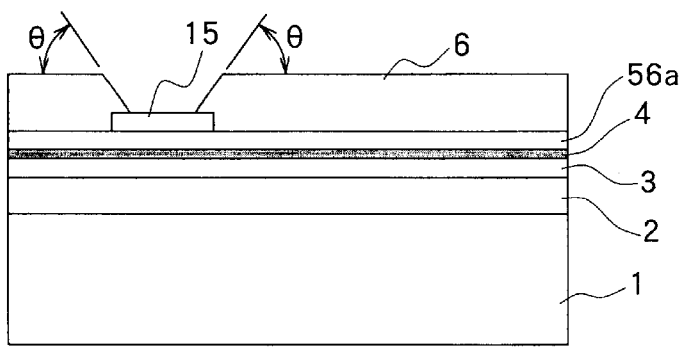
Figure 8:
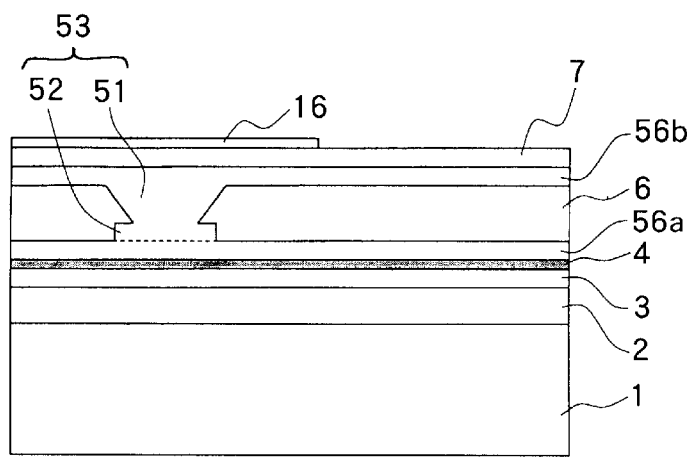
Figure 8:
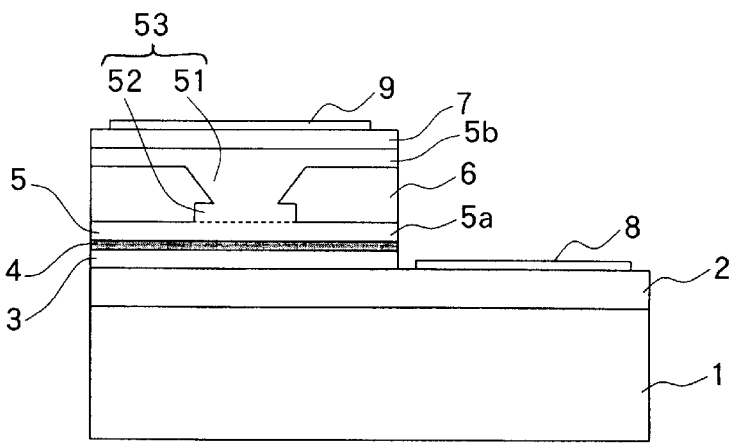

FIG. 8, (a) to (d) show a process for fabricating the nitride semiconductor laser device. A sapphire substrate 1 is placed into a crystal growth apparatus first, and an n-type contact layer 2, n-type cladding layer 3 of AlGaN, active layer 4 and p-type first cladding layer 56a of AlGaN are continuously grown over the sapphire substrate 1 as by the MOCVD process (metal-organic chemical vapor deposition process) as shown in FIG. 8, (a).

The substrate 1 is thereafter taken out of the crystal growth apparatus, and an SiO$_2$ mask 15 is formed on the first cladding layer 56a. At this time, the mask 15 is formed along the direction [1 1 $\bar{2}$ 0] of the nitride semiconductor crystals.

Next, the substrate 1 is placed into the crystal growth apparatus again, and an n-type current blocking layer 6 of AlGaN is grown on the first cladding layer 56a as shown in FIG. 8, (b). Optimum crystal growth conditions are selected for this step to selectively grow the n-type current blocking layer 6 over opposite side portions of the mask 15 and over the exposed surface of the first cladding layer 56a as illustrated. Consequently, the blocking layer 6 is formed with a flat slope extending from the surface of the mask 15 at an inclination angle of about 62 deg with the surface of the active layer 4 at each side of the mask 15.

The substrate 1 is thereafter taken out of the crystal growth apparatus again, the mask 15 is chemically removed as with hydrofluoric acid as shown in FIG. 8, (c), and the substrate 1 is then returned to the interior of the apparatus. A p-type AlGaN layer is grown on the first cladding layer 56a over the surface thereof exposed by the removal of the mask 15 and over the slopes and surface of the n-type current blocking layer 6, whereby a dual stripe portion 53 and a second cladding layer 56b are formed.

The p-type AlGaN layer has satisfactory crystallinity since the slopes of the current blocking layer 6 are flat as stated above. Consequently, the dual stripe portion 53 has a satisfactory crystal state at the interfaces thereof with the current blocking layer 6.

The stripe configuration of the dual stripe portion 53 has its length in the direction [1 1 $\bar{2}$ 0] of the nitride semiconductor crystals.

A p-type GaN contact layer 7 is subsequently grown on the second cladding layer 56b, the substrate 1 is then withdrawn from the crystal growth apparatus, and a stripe of mask 16 is formed on the p-type contact layer 7. The surface of the contact layer 7 is dry-etched through the mask 16 to expose the surface of the n-type contact layer 2 as shown in FIG. 8, (d).

Finally, the mask 16 is removed, and a p-type electrode 9 and n-type electrode 8 are formed on the surfaces of the p-type contact layer 7 and the n-type contact layer 2, respectively.

With the nitride semiconductor laser device shown in FIG. 6, the upper stripe portion 51 of the p-type cladding layer 5 has a minimum width W1 at the position of the boundary between the portion 51 and the lower stripe portion 52, and the width W1 is smaller than the width W2 of the lower stripe portion 52 at the position of its lower end, so that the current flowing through the dual stripe portion 53 toward the active layer 4 is confined in the upper stripe portion 51 and flows into the active layer 4 while being restrained from spreading out laterally. Accordingly, the current injection region of the active layer 4 has a width in conformity with the width W1 of the upper stripe portion 51.

On the other hand, the lower stripe portion 52, which is enlarged as compared with the upper stripe portion 51, laterally increases the spot width, with the result that the spot width of the active layer 4 has a value in conformity with the width W2 of the lower stripe portion 52 and is greater than the width of the current injection region.

Consequently, a saturable absorbing region is formed around the current injection region to produce self-pulsation.

In the case where nitride semiconductor crystals of hexagonal system are to be formed on the sapphire substrate 1 in fabricating the nitride semiconductor laser device described, the nitride semiconductor crystals are oriented as rotated through 30 deg relative to the crystals of the substrate. Accordingly, when the dual stripe portion 53 of the p-type cladding layer 5 is formed in the direction [1 1 $\bar{2}$ 0] of nitride semiconductor crystals and is to be cleaved at the plane (1 1 $\bar{2}$ 0) of the nitride semiconductor crystals, the sapphire substrate 1 is cleaved at the plane (1 $\bar{1}$ 0 0). Since the main cleavage plane of the hexagonal system is the plane (1 $\bar{1}$ 0 0), the sapphire substrate 1 having a large thickness can be easily cleaved at the plane (1 $\bar{1}$ 0 0).

Moreover, because the dual stripe portion 53 of the p-type cladding layer 5 has a satisfactory crystal state at the interface thereof with the n-type current blocking layer 6 as described above, ineffective current not contributing to the lasing operation diminishes with unnecessary absorption of laser light suppressed, giving improved characteristics to the semiconductor laser device.

Third Embodiment

Figure 7:
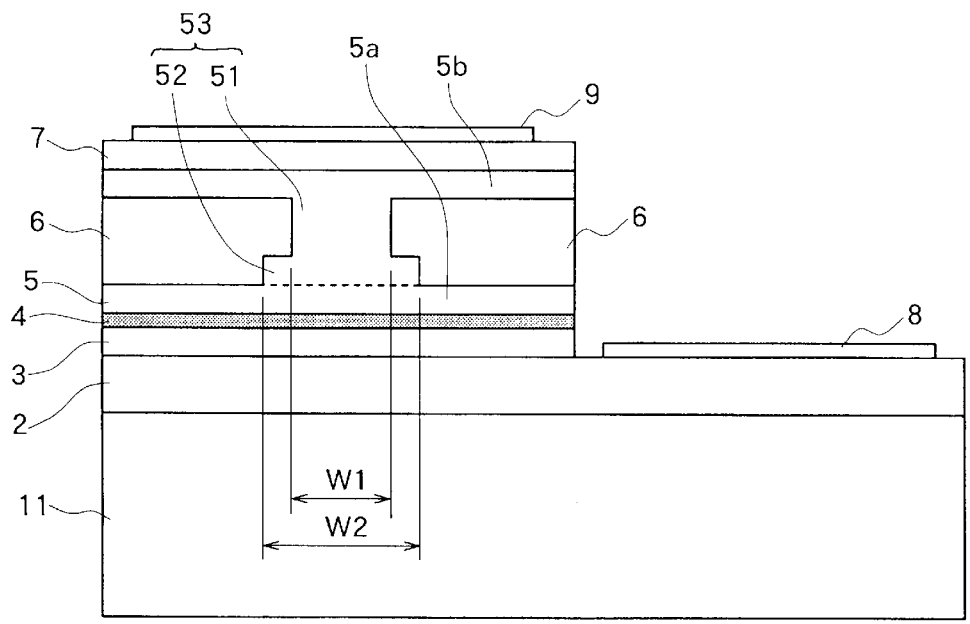
FIG. 7 is a view in section showing the structure of a nitride semiconductor laser device as a third embodiment the invention.

FIG. 7 shows a nitride semiconductor laser device of this embodiment, which comprises as superposed on a GaN substrate 1 an n-type contact layer 2 made from GaN, an n-type cladding layer 3 made from AlGaN, an active layer 4 having a multi-quantum-well structure, a p-type cladding layer 5 made from AlGaN, n-type current blocking layers 6, 6 made from AlGaN and a p-type contact layer 7 made from GaN.

The p-type cladding layer 5 comprises a first flat portion 5a formed over the surface of the active layer 5, a dual stripe portion 53 projecting upwardly from the midportion of the first flat portion 5a and comprising a lower stripe portion 52 and an upper stripe portion 51, and a second flat portion 5b formed over the dual stripe portion 53 and the n-type current blocking layers 6, 6. The dual stripe portion 53 has opposite side faces in contact with the respective n-type current blocking layers 6, 6.

The n-type contact layer 2 is 4.5 $\mu$m in thickness, the n-type cladding layer 3 is 1.0 $\mu$m in thickness, the first flat portion 5a of the p-type cladding layer 5 is 0.15 $\mu$m in thickness, the n-type current blocking layers 6, 6 are 0.30 $\mu$m in thickness, the second flat portion 5b of the p-type cladding layer 5 is 0.10 $\mu$m in thickness, and the p-type contact layer 7 is 0.10 $\mu$m in thickness.

The dual stripe portion 53 of the p-type cladding layer 5 varies in cross sectional area toward the first flat portion 5a, and the rate of variation in the cross sectional area increases in the positive direction at the position of the boundary between the upper stripe portion 51 and the lower stripe portion 52. More specifically, the cross sectional area of the upper stripe portion 51 is approximately constant toward the first flat portion 5a, and the cross sectional area of the lower stripe portion 52 markedly increases at the position of the boundary between the upper and lower stripe portions 51, 52 and remains substantially unchanged toward the first flat portion 5a. Thus, the upper stripe portion 51 has a width W1 (=2 $\mu$m) smaller than the width W2 (=2.5 $\mu$m) of the lower stripe portion 52. The lower stripe portion 52 has a height of 0.1 $\mu$m.

Further the dual stripe portion 53 of the p-type cladding layer 5 is so formed that the stripe configuration thereof has a length in the direction [1 $\bar{1}$ 0 0] of the nitride semiconductor crystals.

An n-type electrode 8 is provided on the n-type contact layer 2, and a p-type electrode 9 on the p-type contact layer 7. The active layer 4 has the same structure as in the first embodiment shown in FIG. 3.

Usable in place of the GaN substrate is an Si substrate, 6H—SiC substrate, 4H—SiC substrate, MgO substrate or MgAl$_2$O$_4$ substrate.

With the nitride semiconductor laser device shown in FIG. 7 as is the case with the first embodiment, the width W1 of the upper stripe portion 51 of the p-type cladding layer 5 is smaller than the width W2 of the lower stripe portion 52, so that a saturable absorbing region is formed around the current injection region in the active layer 4 to produce self-pulsation.

In the case where nitride semiconductor crystals of hexagonal system are to be formed on the GaN substrate 1 in fabricating the nitride semiconductor laser device described, the orientation of the nitride semiconductor crystals is not rotated relative to the crystals of the substrate. Accordingly, when the dual stripe portion 53 of the p-type cladding layer 5 is formed in the direction [1 $\bar{1}$ 0 0] of nitride semiconductor crystals and is to be cleaved at the plane (1 $\bar{1}$ 0 0) of the nitride semiconductor crystals, the GaN substrate 1 is cleaved at the plane (1 $\bar{1}$ 0 0). The GaN substrate 1 can therefore be easily cleaved as in the second embodiment.

Moreover, because the dual stripe portion 53 of the p-type cladding layer 5 is formed in the direction [1 $\bar{1}$ 0 0] of the nitride semiconductor crystals, the current blocking layer 6 is given a flat face which is approximately perpendicular to the active layer 4 by selective growth as in the second embodiment. Accordingly, the dual stripe portion 53 of the p-type cladding layer 5 has a satisfactory crystal state at the interface thereof with the n-type current blocking layer 6, with the result that ineffective current not contributing to the lasing operation diminishes with unnecessary absorption of laser light suppressed, giving improved characteristics to the semiconductor laser device.

Other Embodiments

Figure 9:
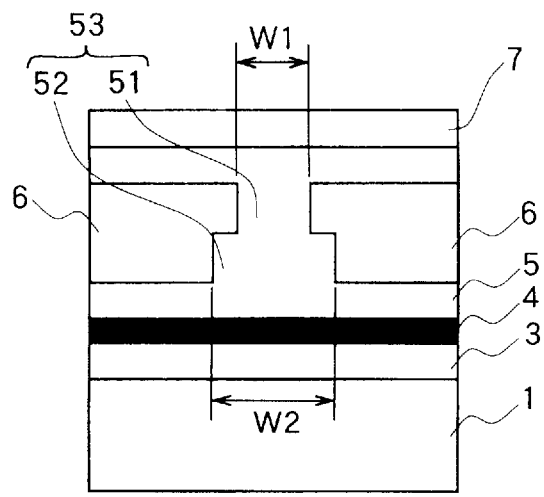
FIGS. 9(a), 9(b) and 9(c) are views in section showing exemplary different structures of nitride semiconductor laser devices embodying the invention.
Figure 9:
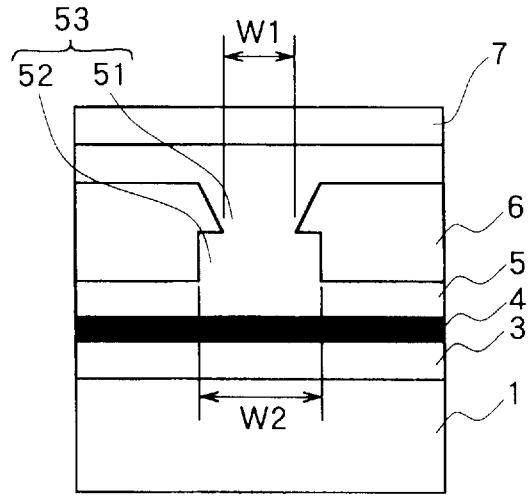
Figure 9:
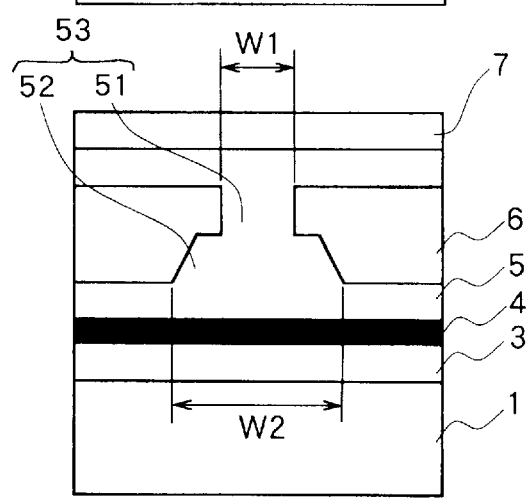

The dual stripe portion 53 of the p-type cladding layer 5 is so shaped in cross section that the upper stripe portion 51 and the lower stripe portion 52 each have a constant width in the direction of the height thereof as shown in FIG. 9(a), or that the upper stripe portion 51 has a width decreasing toward the active layer 4 as shown in FIG. 9(b), whereas the dual stripe portion is not limited to such shapes but can be variously shaped, for example, as shown in FIGS. 9(c), 10(a), 10(b) and 10(c).

Figure 10:
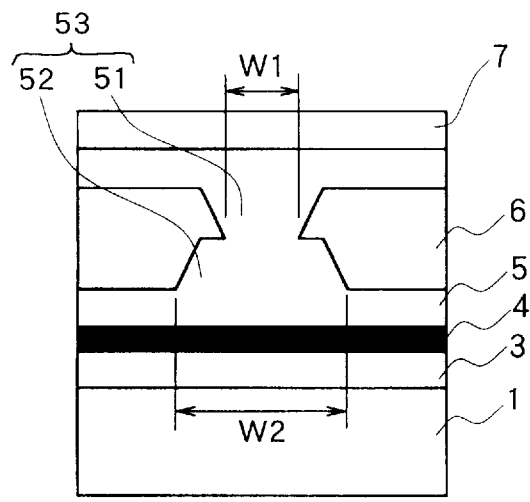
FIGS. 10(a), 10(b) and 10(c) are views in section showing other exemplary structures of nitride semiconductor laser devices embodying the invention.
Figure 10:
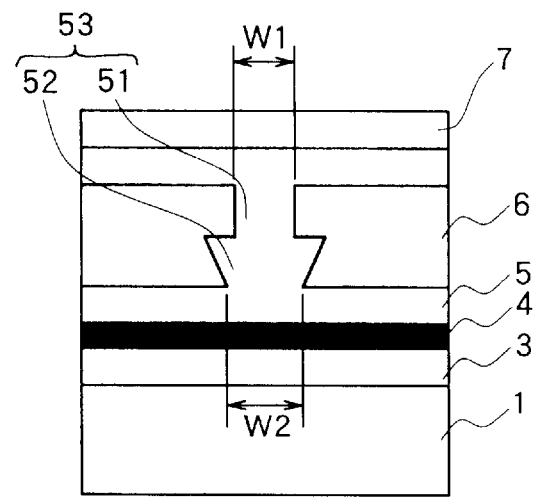
Figure 10:
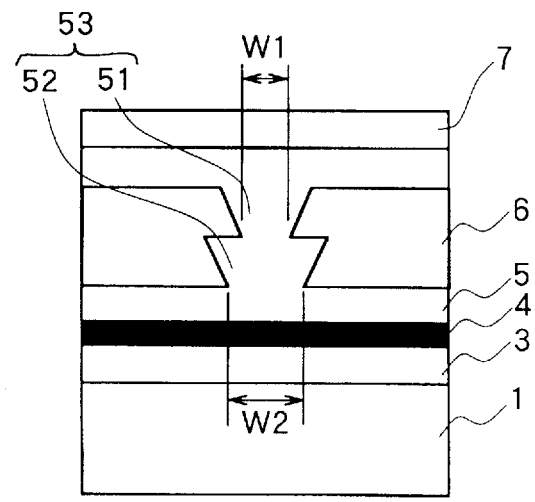
Figure 11:
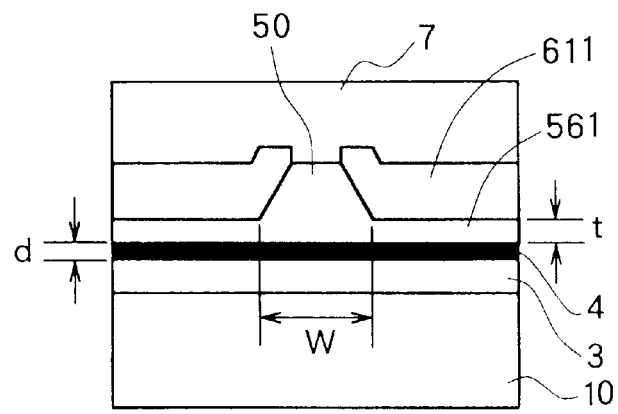
FIG. 11 is a view in section showing the structure of a conventional ridge stripe semiconductor laser device.
Figure 12:
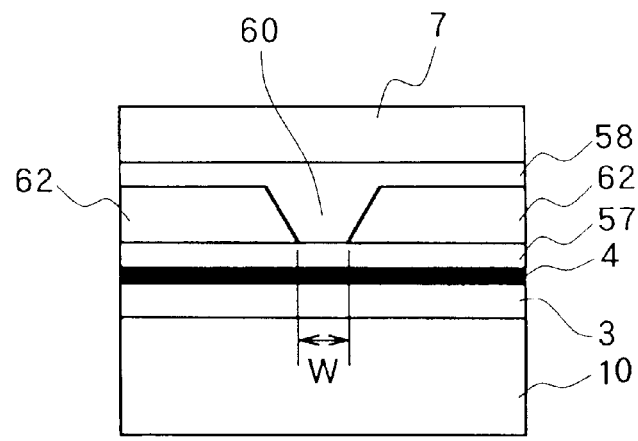
FIG. 12 is a view in section showing the structure of a conventional self-aligned semiconductor laser device.
Figure 13:
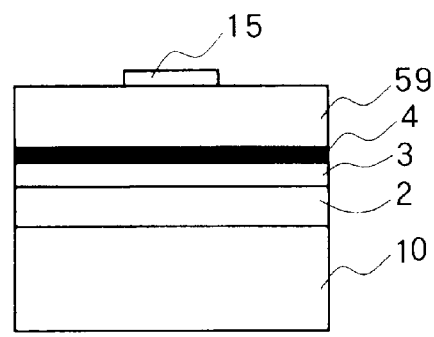
FIG. 13 includes diagrams showing the steps of a process for fabricating the conventional ridge stripe semiconductor laser device.
Figure 13:
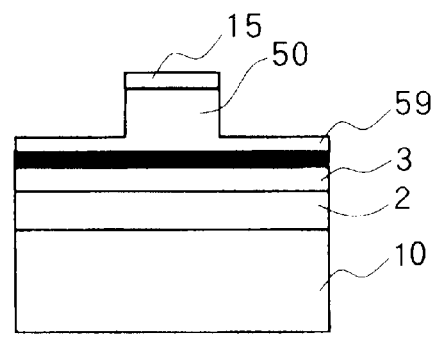
Figure 13:
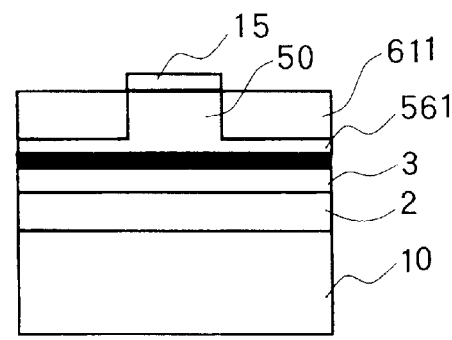
Figure 13:
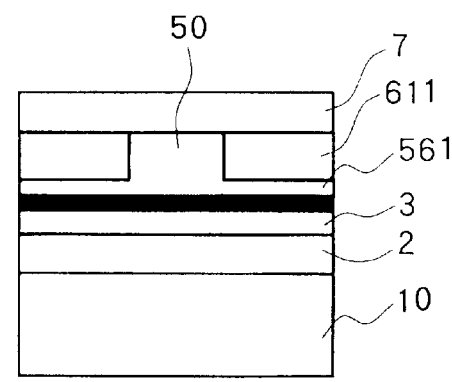
Figure 14:
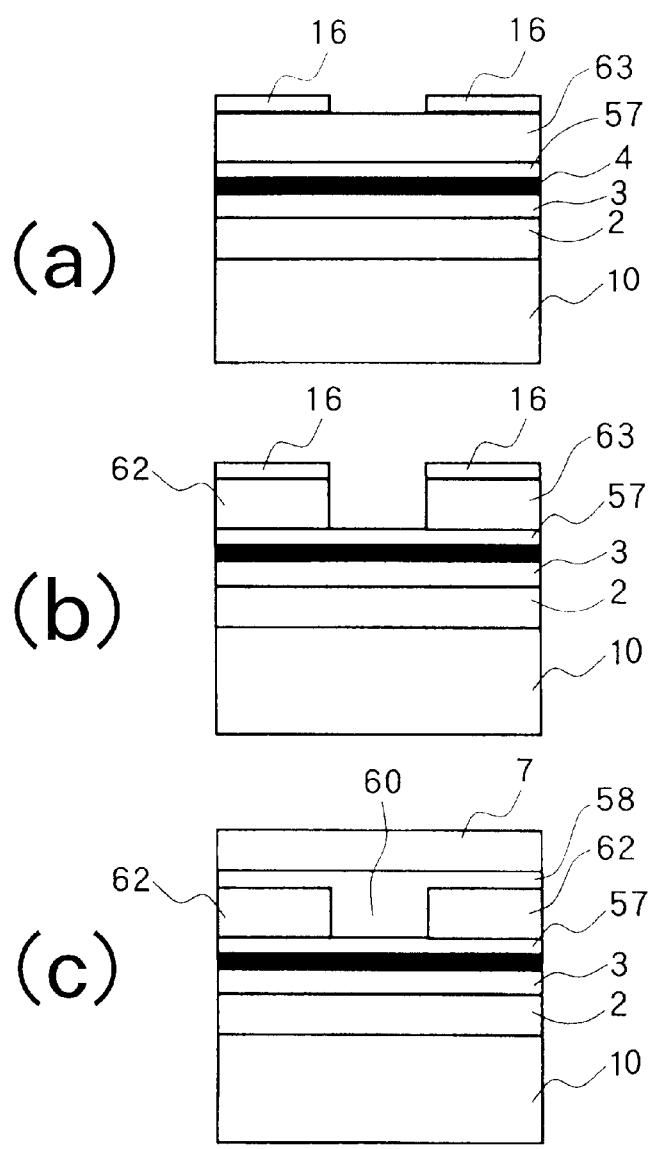
FIG. 14 includes diagrams showing the steps of a process for fabricating the conventional self-aligned semiconductor laser device.

FIG. 9(c) shows a lower stripe portion 52 having a cross sectional shape which is enlarged downward. FIG. 10(a) shows an upper stripe portion 51 having a cross sectional shape which is diminished downward, and a lower stripe portion 52 having a cross sectional shape which is enlarged downward. FIG. 10(b) shows a lower stripe portion 52 which is diminished downward in cross sectional shape. Further FIG. 10(c) shows an upper stripe portion 51 and a lower stripe portion 52 each of which is diminished downward in cross sectional area.

With any of the nitride semiconductor laser devices which are so shaped in cross section as described above, the dual stripe portion 53 of the p-type cladding layer 5 varies toward the active layer 4 in cross sectional area, and the rate of variation in the cross sectional area of the portion 53 increases in the positive direction at the position of the boundary between the upper and lower stripe portions 51, 52.

Further with any of these laser devices, the upper stripe portion 51 of the p-type cladding layer 5 has a minimum width W1 at the position of the boundary between the upper and lower stripe portions 51, 52, and the width W2 of the lower stripe portion 52 at the position of its lower end is greater than the minimum width W1 of the upper stripe portion 51.

In any of these semiconductor laser devices, therefore, the current injection region width is defined by the width W1 of the upper stripe portion 51 of the p-type cladding layer 5, and the spot width by the width W2 of the lower stripe portion 52 to form a saturable absorbing region around the current injection region and generate self-pulsation easily.

Accordingly, the construction of the invention gives a higher degree of freedom in optimizing the device structure parameters and affords greater allowable ranges of dimensional accuracies to the parameters than in the case of conventional semiconductor laser devices, making it possible to fabricate self-pulsation semiconductor laser devices in a high yield.

Since there is no need to give an increased thickness to the active layer 4 for self-pulsation, self-pulsation can be realized without increasing the threshold current or astigmatic distance.

The device of the invention is not limited to the foregoing embodiments in construction but can be modified variously without departing from the spirit of the invention set forth in the appended claims. Besides the embodiments described, a semiconductor laser device may be provided, for example, by forming the lower cladding layer, which is closer to the substrate, from a p-type semiconductor, and the upper cladding layer, which is remote from the substrate, from an n-type semiconductor, and giving a dual stripe structure to the lower cladding layer. In this case, the lower cladding layer provides an upper stripe portion of smaller width by a portion thereof away from the active layer, and a lower stripe portion of increased width by a portion thereof closer to the active layer.

What is claimed is:

1. A nitride semiconductor laser device, comprising:
a first cladding layer formed on a substrate and made from a first conductive-type nitride semiconductor,
an active layer formed on the first cladding layer, and
a second cladding layer formed on the active layer and made from a second conductive-type nitride semiconductor, the second cladding layer including a flat portion formed over the active layer and a dual stripe portion projecting upward from a midportion of the flat portion, a current blocking layer of a first conductive-type nitride semiconductor being formed at each of opposite sides of the dual stripe portion, the dual stripe portion of the second cladding layer including a lower stripe portion formed on the flat portion along a first width extending in cross-section and an upper stripe portion formed on the lower stripe portion along a second width extending in cross-section, the dual stripe portion varying in cross sectional area toward at the flat portion, the rate of variation in the cross sectional area increasing toward a positive direction from the position of a boundary between the upper stripe portion and the lower stripe portion, the first width being larger than the second width.

2. A nitride semiconductor laser device according to claim 1 wherein the upper stripe portion of the second cladding layer is approximately constant or decreases in cross sectional area toward the flat portion, and the dual stripe portion markedly increases in cross sectional area at the position of the boundary between the upper stripe portion and the lower stripe portion.

3. A nitride semiconductor laser device according to claim 1 wherein the current blocking layer is formed from a material greater in band gap energy and smaller in refractive index than the second cladding layer.

4. A nitride semiconductor laser device according to claim 1 wherein the current blocking layer is smaller than the active layer in band gap energy and guides laser light by absorbing light generated in the active layer.

5. A nitride semiconductor laser device according to claim 1 wherein the dual stripe portion of the second cladding layer is so formed that the longitudinal direction of the configuration of the stripe thereof is the direction $[1\,1\,\overline{2}\,0]$ of nitride semiconductor crystals, and the upper stripe portion decreases in cross sectional area toward the flat portion.

6. A nitride semiconductor laser device according to claim 5 wherein the substrate is made from sapphire or GaP.

7. A nitride semiconductor laser device according to claim 1 wherein the dual stripe portion of the second cladding layer is so formed that the longitudinal direction of the configuration of the stripe thereof is the direction $[1\,\overline{1}\,0\,0]$ of nitride semiconductor crystals, and the upper stripe portion is approximately constant in cross sectional area toward the flat portion.

8. A nitride semiconductor laser device according to claim 7 wherein the substrate is made from GaN, Si, 6H—SiC, 4H—SiC, MgO or MgAl$_2$O$_4$.

9. A nitride semiconductor laser device according to claim 1 wherein the active layer 4 has a current injection region with a width smaller than the spot width of the active layer, and a saturable absorbing region is formed around the current injection region.

10. A nitride semiconductor laser device, comprising:
a first cladding layer formed on a substrate and made from a first conductive-type nitride semiconductor,
an active layer formed on the first cladding layer, and
a second cladding layer formed on the active layer and made from a second conductive-type nitride semiconductor, the second cladding layer including a flat portion formed over the active layer and a dual stripe portion projecting upward from a midportion of the flat portion, a current blocking layer of a first conductive-type nitride semiconductor being formed at each of opposite sides of the dual stripe portion, the dual stripe portion of the second cladding layer including a lower stripe portion formed on the flat portion along a first width extending in cross-section and an upper stripe portion formed on the lower stripe portion along a second width extending in cross-section, the width of the upper stripe portion in a direction orthogonal to the longitudinal direction thereof being smaller than the width of the lower stripe portion in the same orthogonal direction, the first width being larger than the second width.

11. A nitride semiconductor laser device according to claim 10 wherein the upper stripe portion of the second cladding layer has a minimum width W1 at the position of a boundary between the upper and lower stripe portions, and the lower stripe portion has at the position of a lower end thereof a width W2 greater than the minimum width W1 of the upper stripe portion.

12. A nitride semiconductor laser device according to claim 10 wherein the lower stripe portion of the second cladding layer projects outward beyond each of opposite side faces of the upper stripe portion at and below the position of a boundary between the upper and lower stripe portions, and the projection has an upper face substantially parallel to an upper surface of the active layer, the lower stripe portion having a greater width than the upper stripe portion at the position of the boundary between the upper and lower stripe portions.

13. A nitride semiconductor laser device according to claim 10 wherein the current blocking layer is formed from a material greater in band gap energy and smaller in refractive index than the second cladding layer.

14. A nitride semiconductor laser device according to claim 10 wherein the current blocking layer is smaller than the active layer in band gap energy and guides laser light by absorbing light generated in the active layer.

15. A nitride semiconductor laser device according to claim 10 wherein the dual stripe portion of the second cladding layer is so formed that the longitudinal direction of the configuration of the stripe thereof is the direction $[1\,1\,\overline{2}\,0]$ of nitride semiconductor crystals, and the upper stripe portion decreases in cross sectional area toward the flat portion.

16. A nitride semiconductor laser device according to claim 15 wherein the substrate is made from sapphire or GaP.

17. A nitride semiconductor laser device according to claim 10 wherein the dual stripe portion of the second cladding layer is so formed that the longitudinal direction of the configuration of the stripe thereof is the direction $[1\,\overline{1}\,0\,0]$ of nitride semiconductor crystals, and the upper stripe portion is approximately constant in cross sectional area toward the flat portion.

18. A nitride semiconductor laser device according to claim 17 wherein the substrate is made from GaN, Si, 6H—SiC, 4H—SiC, MgO or MgAl$_2$O$_4$.

19. A nitride semiconductor laser device according to claim 10 wherein the active layer 4 has a current injection region with a width smaller than the spot width of the active layer, and a saturable absorbing region is formed around the current injection region.

20. A nitride semiconductor laser device, comprising:
a first cladding layer formed on a substrate and made from a first conductive-type nitride semiconductor;
an active layer formed on the first cladding layer;
a second cladding layer formed on the active layer and made from a second conductive-type nitride semiconductor, the second cladding layer including a flat portion and a dual stripe portion, the flat portion having a first flat surface formed over and contacting the active layer and an opposite second flat surface, the dual stripe portion projecting upwardly from the second flat surface and having a lower stripe portion and an upper stripe portion with the lower stripe portion integrally formed therewith and between the second flat surface and the upper stripe portion; and
a current blocking layer of the first conductive-type nitride semiconductor being formed at each of opposite sides of the dual stripe portion, wherein
a first interface being defined as first contacting surfaces of the second flat surface and the lower stripe portion has a first width as viewed in cross-section and a second interface being defined as second contacting surfaces of the lower stripe portion and the upper stripe portion has a second width viewed in cross-section, the first width being larger than the second width.

21. A nitride semiconductor laser device according to claim 20, further comprising a contact layer formed on the blocking layer and the upper stripe portion of the second cladding layer.

22. A nitride semiconductor laser device according to claim 20 wherein the current blocking layer is formed from a material greater in band gap energy and smaller in refractive index than the second cladding layer.

23. A nitride semiconductor laser device according to claim 20 wherein the current blocking layer is smaller than the active layer in band gap energy and guides laser light by absorbing light generated in the active layer.

24. A nitride semiconductor laser device according to claim 20 wherein the dual stripe portion of the second cladding layer is so formed that the longitudinal direction of the configuration of the stripe thereof is the direction [1 1 $\overline{2}$ 0] of nitride semiconductor crystals, and the upper stripe portion decreases in cross sectional area toward the flat portion.

25. A nitride semiconductor laser device according to claim 24 wherein the substrate is made from sapphire or GaP.

26. A nitride semiconductor laser device according to claim 20 wherein the dual strip portion of the second cladding layer is so formed that the longitudinal direction of the configuration of the stripe thereof is the direction [1 $\overline{1}$ 0 0] of nitride semiconductor crystals, and the upper strip portion is approximately constant in cross sectional area toward the flat portion.

27. A nitride semiconductor laser device according to claim 26 wherein the substrate is made from GaN, Si, 6H—SiC, 4H—SiC, MgO or $MgAl_2O_4$.

28. A nitride semiconductor laser device according to claim 20 wherein the active layer has a current injection region with a width smaller than the spot width of the active layer, and a saturable absorbing region is formed around the current injection region.

* * * * *